(12) United States Patent
Nishi et al.

(10) Patent No.: US 8,890,311 B2
(45) Date of Patent: Nov. 18, 2014

(54) POWER CONVERSION DEVICE

(71) Applicant: Kabushiki Kaisha Toyota Jidoshokki, Aichi-ken (JP)

(72) Inventors: Shinsuke Nishi, Kariya (JP); Shogo Mori, Kariya (JP)

(73) Assignee: Kabushiki Kaisha Toyota Jidoshokki, Aichi-Ken (JP)

( * ) Notice: Subject to any disclaimer, the term of this patent is extended or adjusted under 35 U.S.C. 154(b) by 0 days.

(21) Appl. No.: 13/775,841

(22) Filed: Feb. 25, 2013

(65) Prior Publication Data

US 2013/0228910 A1    Sep. 5, 2013

(30) Foreign Application Priority Data

Mar. 1, 2012   (JP) .................. 2012-045894

(51) Int. Cl.
| H01L 23/10 | (2006.01) |
| H01L 23/46 | (2006.01) |
| H01L 23/473 | (2006.01) |
| H01L 23/373 | (2006.01) |
| H01L 23/433 | (2006.01) |
| H02M 7/00 | (2006.01) |
| H01L 23/00 | (2006.01) |
| H01L 25/07 | (2006.01) |

(52) U.S. Cl.
CPC ............ *H01L 23/46* (2013.01); *H01L 23/473* (2013.01); *H01L 23/3735* (2013.01); *H01L 23/4334* (2013.01); *H02M 7/003* (2013.01); *H01L 24/34* (2013.01); *H01L 25/072* (2013.01); *H01L 2224/48091* (2013.01); *H01L 2224/49175* (2013.01)
USPC ........................... 257/706; 257/714; 257/796

(58) Field of Classification Search
USPC ........................................ 257/706, 714, 796
See application file for complete search history.

(56) References Cited

U.S. PATENT DOCUMENTS

| 6,542,365 B2 * | 4/2003 | Inoue ............................ 361/699 |
| 8,710,644 B2 * | 4/2014 | Sato .............................. 257/692 |
| 2001/0033477 A1 | 10/2001 | Inoue et al. | |
| 2008/0164588 A1 * | 7/2008 | Lee et al. ....................... 257/668 |
| 2013/0335920 A1 * | 12/2013 | Murata .......................... 361/699 |

FOREIGN PATENT DOCUMENTS

| JP | 6-50349 | 7/1994 |
| JP | 2005-057102 | 3/2005 |

OTHER PUBLICATIONS

Korea Office action, mail date is Apr. 28, 2014.

* cited by examiner

*Primary Examiner* — Trung Q Dang
(74) *Attorney, Agent, or Firm* — Greenblum & Bernstein, P.L.C.

(57) ABSTRACT

A power conversion device is provided with a plurality of semiconductor modules. Each semiconductor module includes a heat dissipation member, an insulating substrate, a semiconductor element, an external connection terminal, and a resin portion. The insulating substrate is fixed to the heat dissipation member. The semiconductor element is mounted on the insulating substrate. The external connection terminal includes a first end, which is electrically connected to the semiconductor element, and an opposite second end. The resin portion is molded to the insulating substrate, the semiconductor element, the first end, and at least part of the heat dissipation member. The semiconductor modules each form a unit.

9 Claims, 10 Drawing Sheets

Fig.2
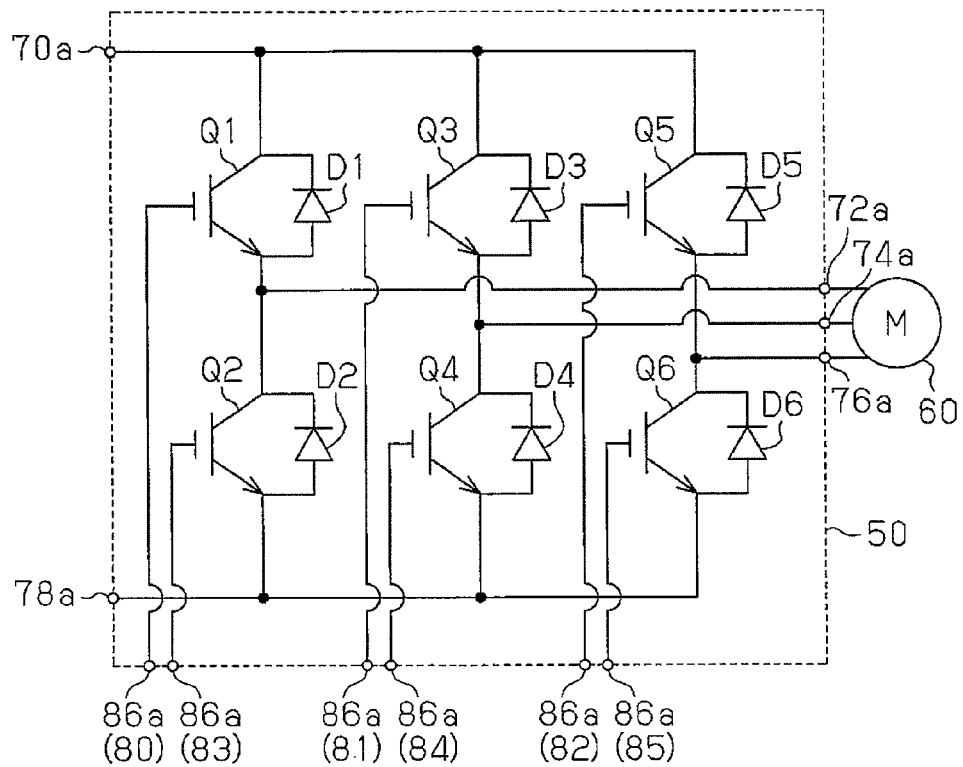
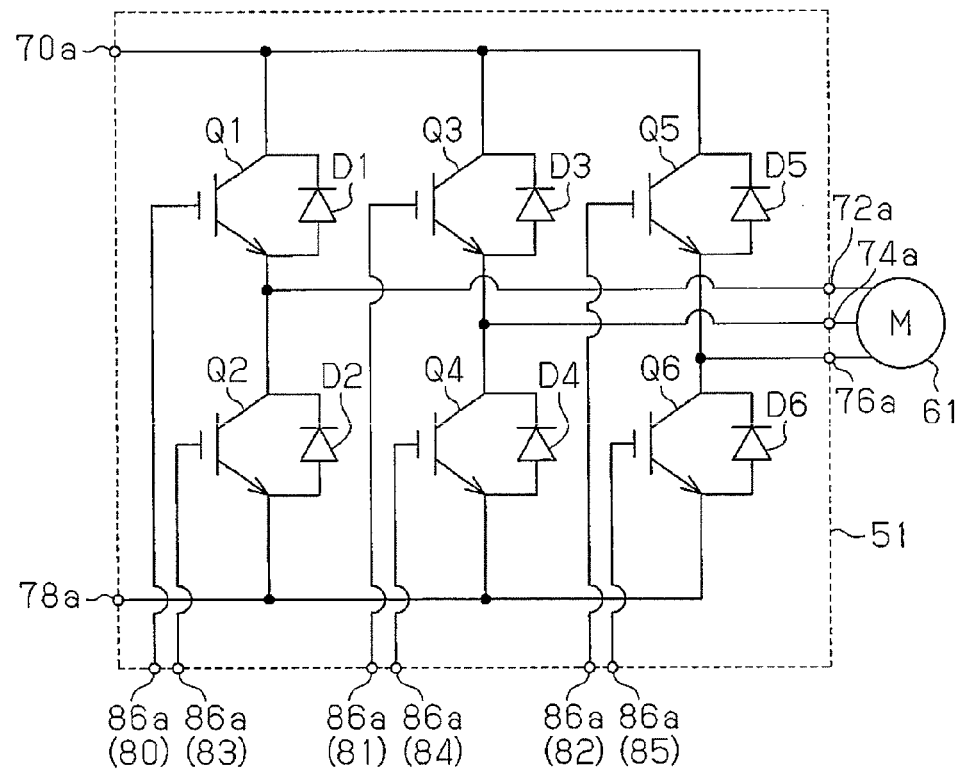

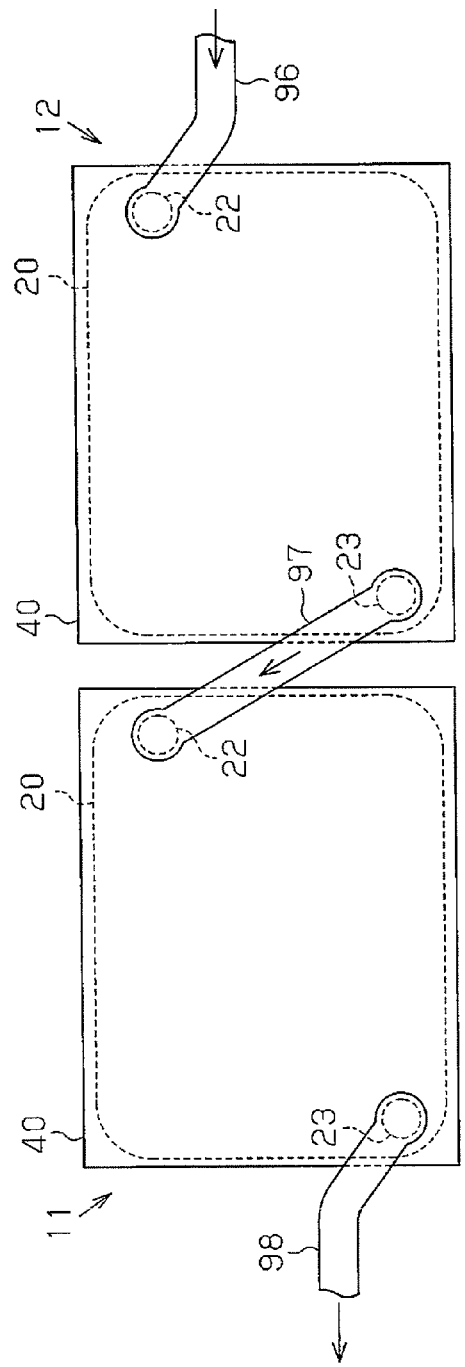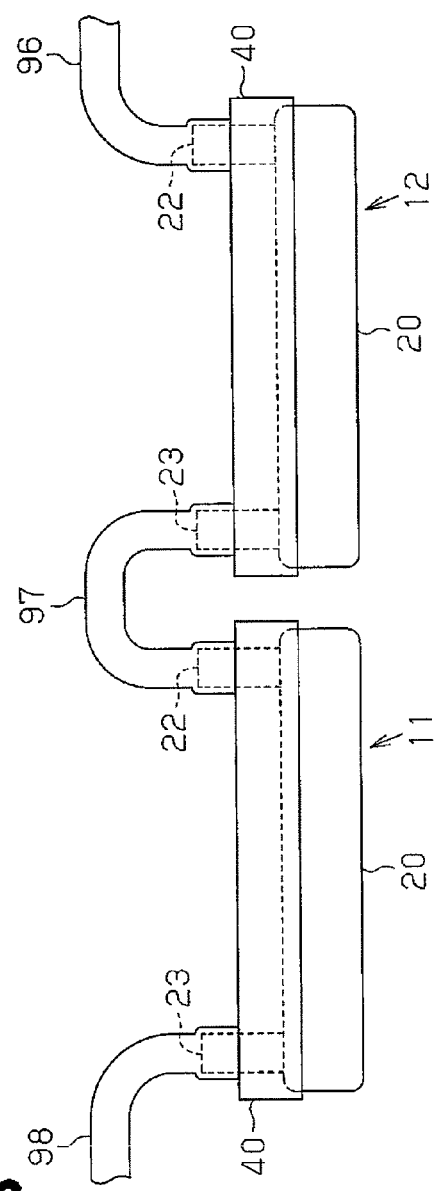

POWER CONVERSION DEVICE

BACKGROUND OF THE INVENTION

The present invention relates to a power conversion device.

Japanese Laid-Open Patent Publication No. 2005-57102 discloses a semiconductor cooling unit provided with a semiconductor module, which includes a power semiconductor element, and two flat cooling tubes, each including a hollow portion through which a refrigerant flows. The semiconductor module is arranged between the two cooling tubes, which face to each other. The two cooling tubes, the semiconductor module, and a molded resin portion integrally covering the cooling tubes and the semiconductor module form a basic unit.

When a plurality of power conversion circuits are provided with a single cooling device to form a single semiconductor device, component deterioration would result in the entire semiconductor device including the cooling device being defective.

SUMMARY OF THE INVENTION

It is an object of the present invention to provide a power conversion device that allows for measures to be easily taken when deterioration occurs in a component.

To achieve the above object, one aspect of the present invention is a power conversion device provided with a plurality of semiconductor modules. Each of the semiconductor modules includes a heat dissipation member, an insulating substrate, a semiconductor element, an external connection terminal and a resin portion. The heat dissipation member includes a heat dissipation portion. The insulating substrate is fixed to the heat dissipation member. The semiconductor element is mounted on the insulating substrate. The external connection terminal includes a first end, which is electrically connected to the semiconductor element, and an opposite second end. The resin portion is molded to the insulating substrate, the semiconductor element, the first end, and at least part of the heat dissipation member. The semiconductor modules each form a unit.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 2 is a circuit diagram of an inverter module shown in FIG. 1A;

FIG. 8A is a front view showing a modified inverter module unit;

FIG. 8B is a front view showing the inverter module unit of FIG. 8A;

DETAILED DESCRIPTION OF THE INVENTION

A vehicle inverter according to one embodiment of the present invention will now be described with reference to the drawings.

Figure 1A:
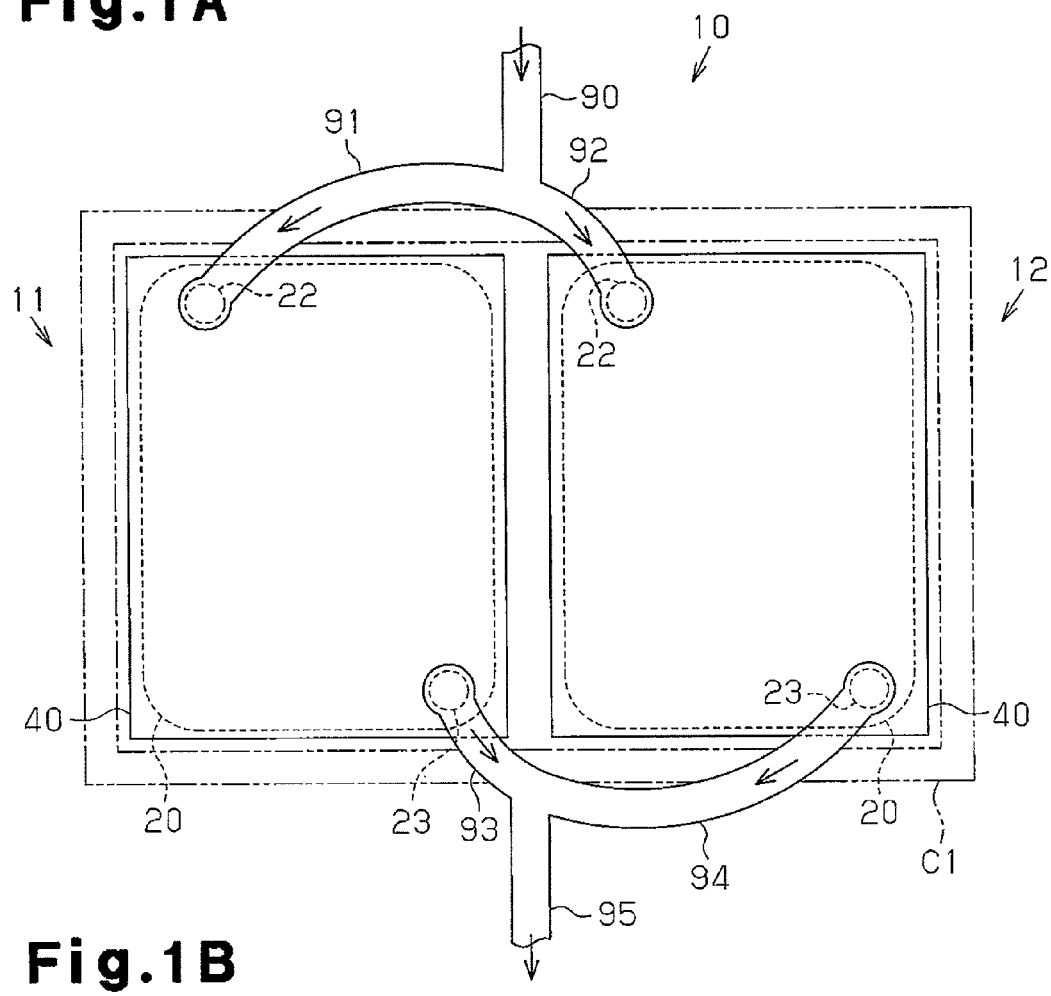
FIG. 1A is a plan view of an inverter module unit according to one embodiment of the present invention.
Figure 1B:
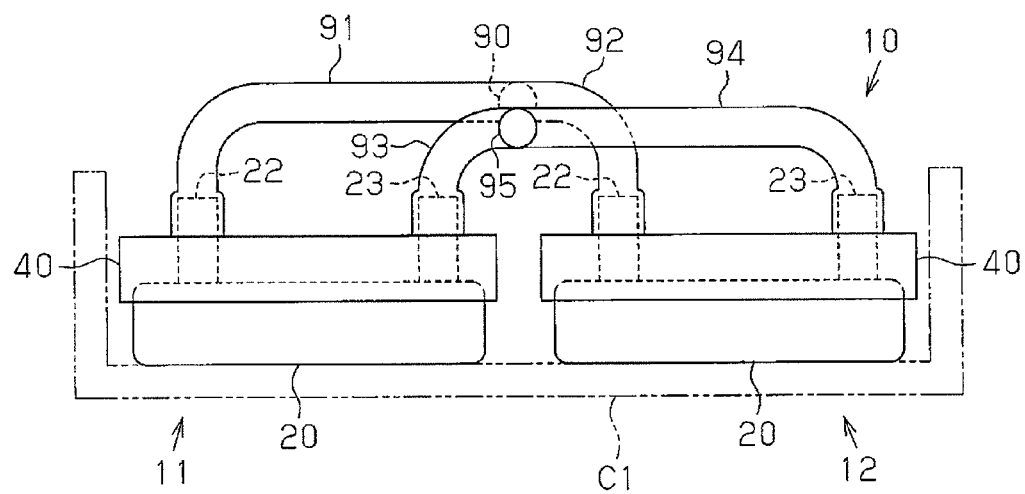
FIG. 1B is a front view of the inverter module unit shown in FIG. 1A.

Referring to FIGS. 1A and 1B, an inverter module unit 10 includes a first inverter module 11, which serves as a first semiconductor module, a second inverter module 12, which serves as a second semiconductor module, and coolant pipes 90, 91, 92, 93, 94, and 95.

The first inverter module 11 and the second inverter module 12 have the same structure.

Figure 3A:
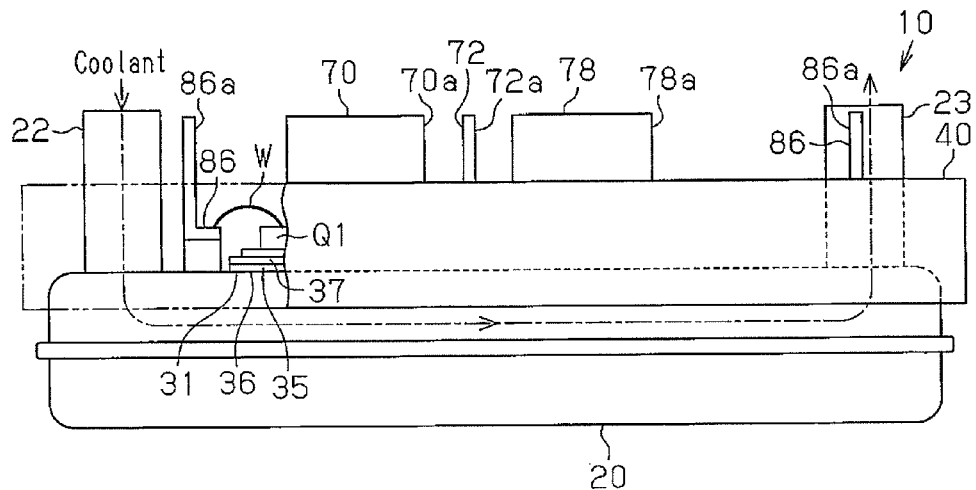
FIG. 3A is a front view of the inverter module shown in FIG. 1A.
Figure 3B:
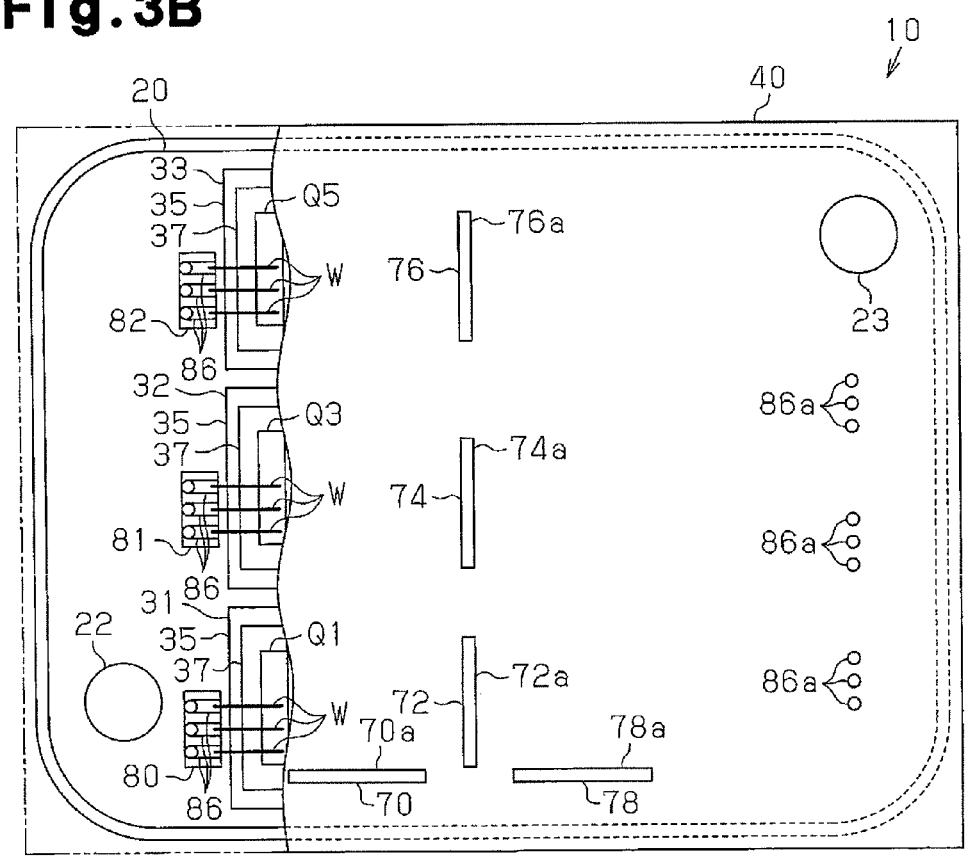
FIG. 3B is a plan view of the inverter module shown in FIG. 3A.
Figure 4A:
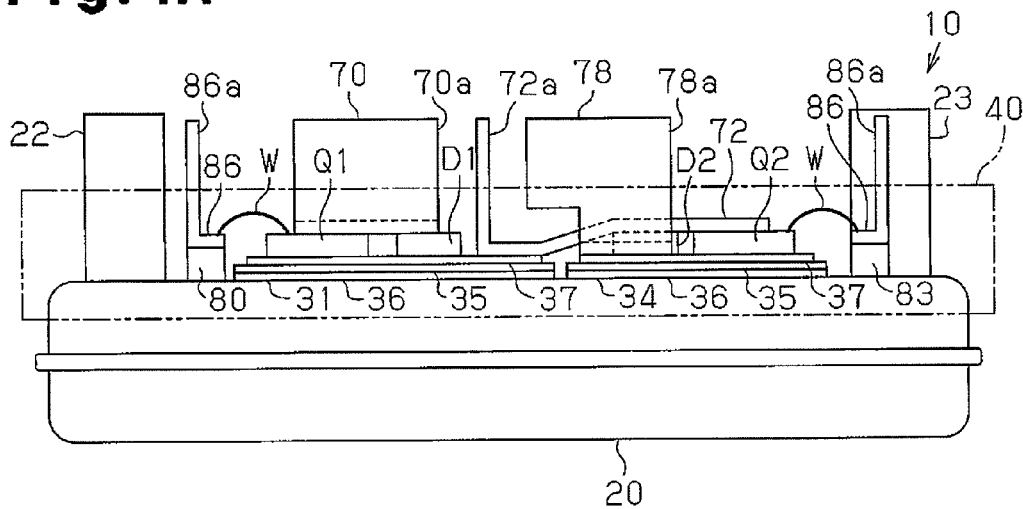
FIG. 4A is a front view of the inverter module shown in FIG. 3A in a state in which a resin portion is eliminated.
Figure 4B:
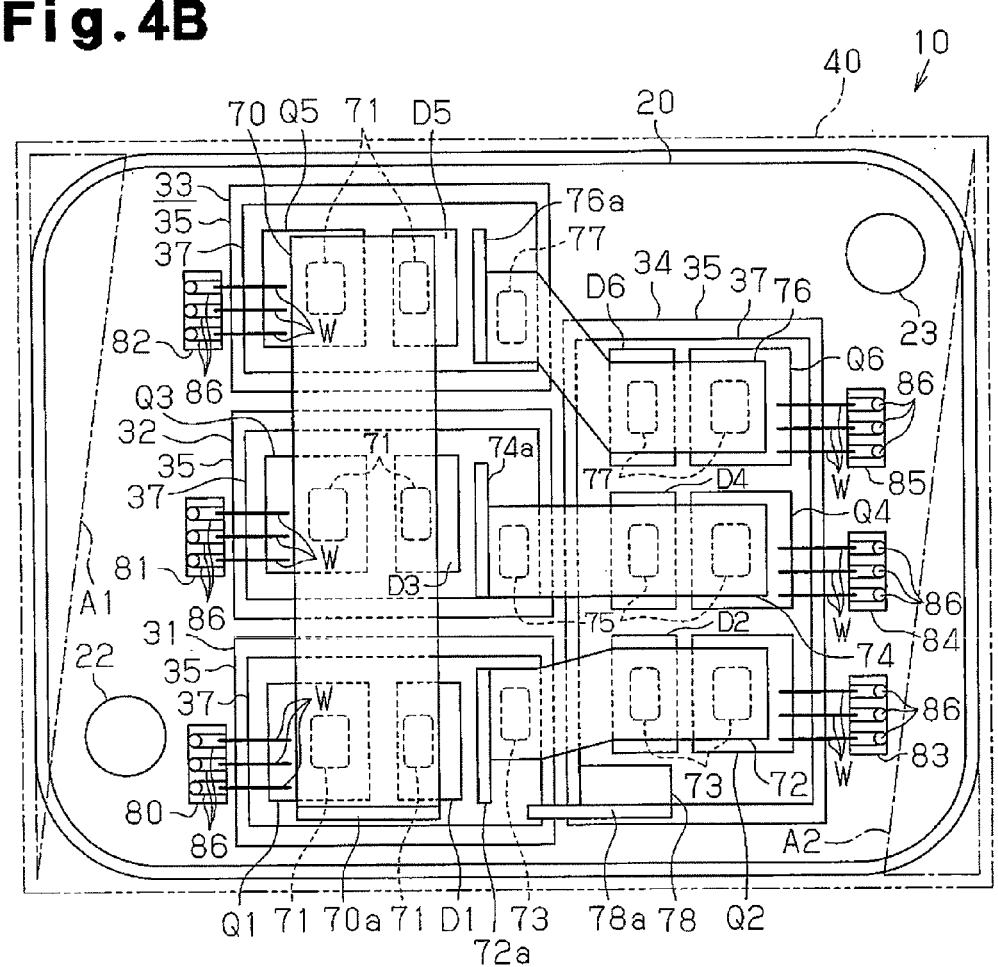
FIG. 4B is a plan view of the inverter module shown in FIG. 4A.

Referring to FIGS. 3A and 3B, each of the inverter modules 11 and 12 includes a cooling device. The inverter module 10 is resin-molded and includes substrates on which semiconductor elements (chips) are mounted. As shown in FIGS. 3A to 4B, each of the inverter modules 11 and 12 includes a water-cooling type cooling device 20, four insulating substrates 31, 32, 33 and 34, six transistors (chips) Q1, Q2, Q3, Q4, Q5, and Q6, six diodes (chips) D1, D2, D3, D4, D5, and D6, and a molded resin portion 40. The resin portion 40 may be formed from, for example, epoxy resin.

FIG. 2 shows the circuit configuration of the inverter module unit 10. The inverter module 11 includes an inverter 50, which converts DC power supplied from an external device, to AC power. Then, the inverter 50 supplies the AC power to a travel motor 60. This drives the motor 60, which produces rotation.

In detail, the inverter 50 includes a plurality of arms, namely, a U-phase arm, a V-phase arm, and a W-phase arm arranged in parallel between a power supply line and a ground line. The arms include two series-connected transistors (IGBT) Q1 and Q2, Q3 and Q4, and Q5 and Q6, respectively. Diodes D1, D2, D3, D4, D5, and D6 are arranged between the collector and emitter of the transistors Q1, Q2, Q3, Q4, Q5, and Q6, respectively. Each of the diodes D1 to D6 allows for current to pass from the emitter to the collector of the corresponding transistor.

In the same manner, the inverter module 12 includes an inverter 51, which converts DC power supplied from an external device, to AC power. Then, the inverter 51 supplies the AC power to a travel motor 61. This drives the motor 61, which produces rotation. In detail, the inverter 50 includes a plurality of arms, namely, a U-phase arm, a V-phase arm, and a W-phase arm arranged in parallel between a power supply line and a ground line. The arms include two series-connected transistors (IGBT) Q1 and Q2, Q3 and Q4, and Q5 and Q6, respectively. Diodes D1, D2, D3, D4, D5, and D6 are arranged between the collector and emitter of the transistors Q1, Q2, Q3, Q4, Q5, and Q6, respectively. Each of the diodes D1 to D6 allows for current to pass from the emitter to the collector of the corresponding transistor.

In this manner, the inverters 50 and 51, which serve as power conversion circuits, are formed in the inverter module unit 10, which serves as a single semiconductor device.

As shown in FIGS. 3A to 4B, the insulating substrates 31, 32, 33, and 34 are formed by direct brazed aluminum (DBA) substrates. Each DBA substrate includes a ceramic substrate 35, an aluminum layer 36, which is formed on a first surface of the ceramic substrate 35, and an aluminum layer 37, which is formed on a second surface of the ceramic substrate 35. The aluminum layer 36 is patterned on the first surface of the ceramic substrate 35. In the same manner, the aluminum layer 37 is patterned on the second surface of the ceramic substrate 35.

Figure 6:
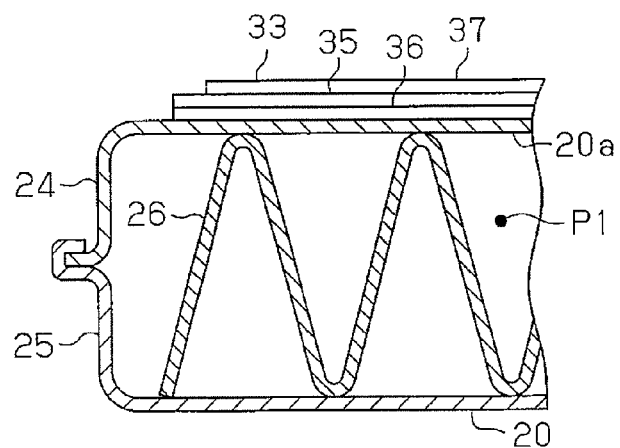
FIG. 6 is a cross-sectional view taken along VI-VI in FIG. 5B.

The cooling device 20 has the shape of a tetragonal box having a low profile and is formed from aluminum. As shown in FIG. 6, the cooling device 20 includes an upper plate 24, which functions as a first shell plate, a lower plate 25, which functions as a second shell plate, and inner fins 26, which are undulated. A peripheral portion of the upper plate 24 and a peripheral portion of the lower plate 25 are swaged together. In this state, the peripheral portions of the upper plate 24 and the lower plate 25 are brazed to each other. This brazes the upper plate 24 and the lower plate 25 at their peripheral portions in the cooling device 20. A coolant passage P1 is formed between the upper plate 24 and the lower plate 25. The inner fins 26 are also brazed to and between the upper plate 24 and lower plate 25.

The cooling device 20 includes a coolant passage P1 (refer to FIG. 6). Further, the cooling device 20 has an inner surface 20a that functions as a heat dissipation portion. An inlet pipe 22 is coupled to the upper surface of the cooling device 20 and allows for coolant to be supplied into the cooling device 20 through a port 27a (refer to FIG. 5B), which is formed in the cooling device 20. In the same manner, an outlet pipe 23 is coupled to the upper surface of the cooling device 20 and allows for coolant to be discharged from the cooling device 20 through a port 27b (refer to FIG. 5B), which is formed in the cooling device 20. More specifically, a pump sends coolant into the cooling device 20 through the inlet pipe 22 and discharges the coolant from the cooling device 20 through the outlet pipe 23.

The insulating substrates 31, 32, 33, and 34 are brazed and fixed to the outer surface of the cooling device 20. The transistors (chips) Q1 to Q6 and the diodes (chips) D1 to D6, which serve as semiconductor elements, are mounted on the insulating substrates 31, 32, 33, and 34. In detail, the aluminum layer 36 under the ceramic substrate 35 in each of the four insulating substrates 31, 32, 33, and 34 is joined by a brazing material with the upper surface of the cooling device 20.

The aluminum layer 37 on the ceramic substrate 35 in the insulating substrate 31 is a wiring material. The transistor (chip) Q1 and the diode (chip) D1 are soldered and joined with the upper surface of the aluminum layer 37. The aluminum layer 37 on the ceramic substrate 35 in the insulating substrate 32 is a wiring material. The transistor (chip) Q3 and the diode (chip) D3 are soldered and joined with the upper surface of the aluminum layer 37. The aluminum layer 37 on the ceramic substrate 35 in the insulating substrate 33 is a wiring material. The transistor (chip) Q5 and the diode (chip) D5 are soldered and joined with the upper surface of the aluminum layer 37. The aluminum layer 37 on the ceramic substrate 35 in the insulating substrate 34 is a wiring material. The transistors (chips) Q2, Q4, and Q6 and the diodes (chips) D2, D4, and D6 are soldered and joined with the upper surface of the aluminum layer 37.

The collector terminals on the upper surfaces of the transistors Q1, Q3, and Q5 and the cathode terminals on the upper surfaces of the diodes D1, D3, and D5 are joined with a conductive plate 70, which functions as an external connection terminal, by solder 71. The collector terminal on the upper surface of the transistor Q2, the cathode terminal on the upper surface of the diode D2, and the aluminum layer 37 in the insulating substrate 31 (the emitter of the transistor Q1 and the anode of the diode D1) are joined with a conductive plate 72, which functions as an external connection terminal, by solder 73. Further, the collector terminal on the upper surface of the transistor Q4, the cathode terminal on the upper surface of the diode D4, and the aluminum layer 37 in the insulating substrate 32 (i.e., the emitter of the transistor Q3 and the anode of the diode D3) are joined with a conductive plate 74, which functions as an external connection terminal, by solder 75. The collector terminal on the upper surface of the transistor Q6, the cathode terminal on the upper surface of the diode D6, and the aluminum layer 37 in the insulating substrate 33 (i.e., the emitter of the transistor Q5 and the anode of the diode D5) are joined with a conductive plate 76, which functions as an external connection terminal, by solder 77. A conductive plate 78, which functions as an external connection terminal, is soldered to the aluminum layer 37 on the ceramic substrate 35 in the insulating substrate 34. The conductive plates 70, 72, 74, 76, and 78 are formed from copper. The conductive plates 70, 72, 74, 76, and 78 each include a first end a second end. The first ends of the conductive plates 70, 72, 74, 76, and 78 are electrically connected to the corresponding transistors Q1, Q2, Q3, Q4, Q5, and Q6 and the corresponding diodes D1, D2, D3, D4, D5, and D6.

The second end of the conductive plate 70 is bent upward. In the same manner, the second end of the conductive plate 72 is bent upward. The second end of the conductive plate 74 is bent upward. The second end of the conductive plate 76 is bent upward. The second end of the conductive plate 78 is bent upward.

Six connection pin seats 80, 81, 82, 83, 84, and 85 are fixed to the upper surface the cooling device 20. Three connection pins 86, which function as external connection terminals, are fixed to each of the connection pin seats 80, 81, 82, 83, 84, and 85. The connection pins 86 are formed from copper. One of the three connection pins 86 forms a gate voltage application line, and the two remaining connection pins 86 form an emitter voltage detection line and an emitter temperature detection line. The three connection pins 86 include first ends electrically connected by wires W formed by a wiring material, or wire-bonded, to the transistors (chips) Q1, Q2, Q3, Q4, Q5, and Q6.

The three connection pins 86 include the first ends, which are electrically connected to the corresponding transistors Q1, Q2, Q3, Q4, Q5, and Q6, and second ends, which are bent upward.

The resin portion 40 covers the components arranged on the upper surface of the cooling device 20 (i.e., the insulating substrates 31, 32, 33, and 34, the transistors Q1, Q2, Q3, Q4, Q5, and Q6, the diodes D1, D2, D3, D4, D5, and D6, the conductive plates 70, 72, 74, 76, and 78, the connection pins 86, and the wire W). The conductive plates 70, 72, 74, 76, and 78 include upright portions 70a, 72a, 74a, 76a, and 78a with upper ends exposed from the resin portion 40. In the same manner, the three connection pins 86, which are connected to each of the transistors Q1, Q2, Q3, Q4, Q5, and Q6, include upright portions 86a with upper ends exposed from the resin portion 40.

As described above, the insulating substrates 31, 32, 33, and 34 are integrated with the cooling device 20. Further, the semiconductor elements (i.e., the transistors Q1, Q2, Q3, Q4, Q5, and Q6 and the diodes D1, D2, D3, D4, D5, and D6) and the conductive plates 70, 72, 74, 76, and 78 are soldered onto the insulating substrates 31, 32, 33, and 34. Then, the resin portion 40 is molded onto all of the insulating substrates 31, 32, 33, and 34, the cooling device 20, the semiconductor elements, and the conductive plates 70, 72, 74, 76, and 78. This forms a semiconductor module.

Further, the resin portion 40 is molded onto the insulating substrates 31, 32, 33, and 34, the transistors Q1 to Q6, the diodes D1 to D6, the first ends of the conductive plates 70, 72, 74, 76, and 78, the first ends of the connection pins 86, and the cooling device 20 in a state in which the second ends of the conductive plates 70, 72, 74, 76, and 78 and the second ends of the connection pins 86 are exposed from the resin portion 40. This forms a plurality of semiconductor modules.

The inlet pipe 22 and the outlet pipe 23 are connected to the upper surface of the cooling device 20.

As shown in FIGS. 1A and 1B, the two inverter modules 11 and 12 are arranged in the case C1. In detail, the case C1 is box-shaped and includes an upper opening. The inverter modules 11 and 12 are arranged on a bottom surface in the case C1 at the left and right sides. The pipe 90 braches into the two pipes 91 and 92. The pipe 91 is coupled to the inlet pipe 22 of the inverter module 11, and the pipe 92 is coupled to the inlet pipe 22 of the inverter module 12. The outlet pipe 23 of the inverter module 11 is coupled to the pipe 93, and the outlet pipe 23 of the inverter module 12 is coupled to the pipe 94. The pipes 93 and 94 are coupled to the pipe 95.

The inverter modules 11 and 12 formed as described above are replaceable components. Further, each of the inverter modules 11 and 12 forms a unit.

The operation of the inverter module unit 10 will now be described.

The inverter modules 11 and 12 of the inverter module unit 10 are arranged in the case C1. Further, the pipes 91, 92, 93, and 94 connect the inlet pipes 22 and outlet pipes 23 of the inverter modules 11 and 12. Coolant is supplied from the pipe 90 via the pipes 91 and 92 to the inverter modules 11 and 12.

Coolant is supplied into the cooling device 20 through the inlet pipe 22. The coolant flows through the cooling device 20 toward the outlet pipe 23. Then, the coolant is discharged from the cooling device 20 through the outlet pipe 23. The six transistors Q1, Q2, Q3, Q4, Q5, and Q6 of the inverter module unit 10 each generate heat when performing a switching operation. The six diodes D1, D2, D3, D4, D5, and D6 also generate heat when activated. The heat generated by the transistors Q1, Q2, Q3, Q4, Q5, and Q6 is transferred to the cooling device 20 through the insulating substrates 31, 32, 33, and 34 (DBA substrates), which transfer heat to the coolant flowing through the cooling device 20. In the same manner, the heat generated by the six diodes D1, D2, D3, D4, D5, and D6 is transferred to the cooling device 20 through the insulating substrates 31, 32, 33, and 34 (DBA substrates), which transfer heat to the coolant flowing through the cooling device 20.

The coolant that exchanged heat in the inverter modules 11 and 12 is discharged through the pipes 93 and 94 and collected in the pipe 95. The coolant is then discharged through the pipe 95 from the inverter module unit 10.

A method for manufacturing the inverter module unit 10 will now be described with reference to FIGS. 1A to 2B and FIGS. 3A to 7B.

Figure 5A:
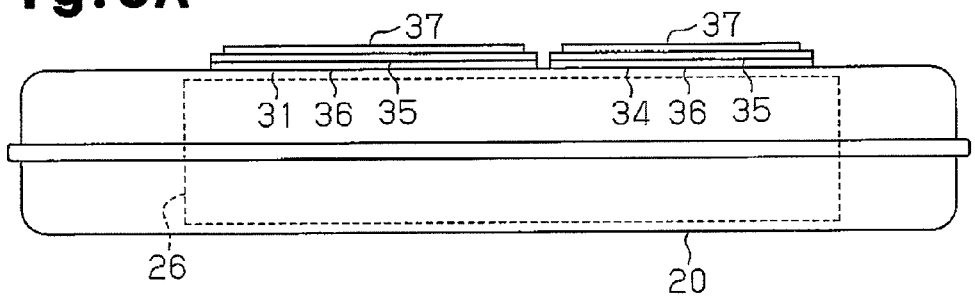
FIG. 5A is a front view showing a cooling device and insulating substrates of FIG. 4A.
Figure 5B:
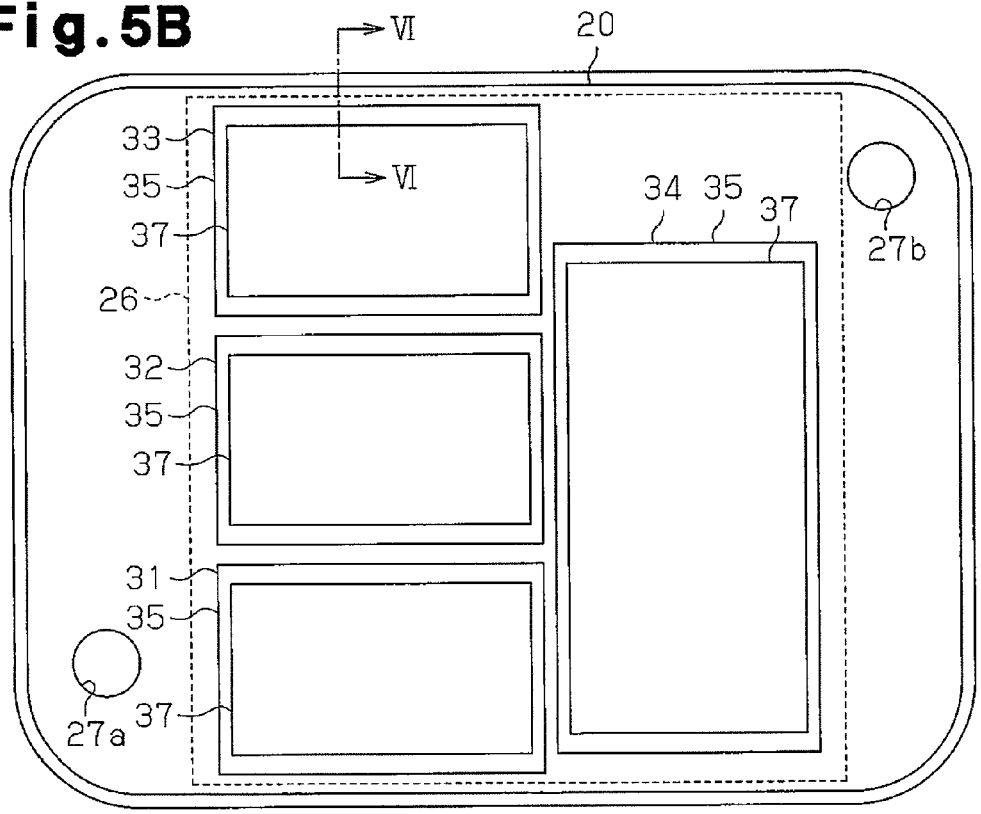
FIG. 5B is a plan view showing the cooling device and the insulating substrates of FIG. 4A.

Referring to FIGS. 5A to 6, the insulating substrates 31, 32, 33, and 34 (DBA substrates) are prepared. The aluminum layer 36 is patterned on one surface of the ceramic substrate 35, and the aluminum layer 37 is patterned on the other surface of the ceramic substrate 35. The peripheral portions of the upper plate 24 and lower plate 25, which form the cooling device 20, are swaged and brazed together. Further, the undulated inner fins 26 are also brazed between the upper plate 24 and the lower plate 25. At the same time, the insulating substrates 31, 32, 33, and 34 (DBA substrates) are brazed to the upper surface of the cooling device 20. In detail, the aluminum layer 36 under the ceramic substrate 35 in each of the four insulating substrates 31, 32, 33, and 34 is brazed to the upper surface of the cooling device 20. The brazing is performed at about 600° C.

Figure 7A:
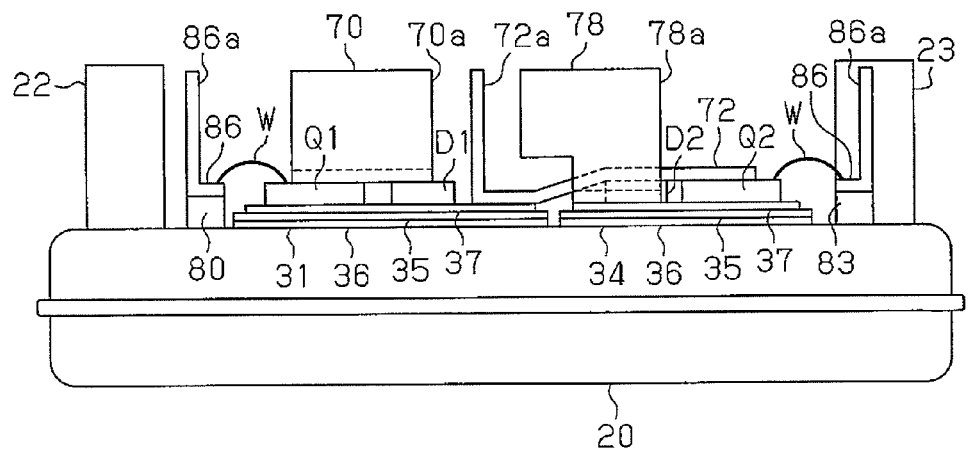
FIG. 7A is a front view illustrating a manufacturing process of the inverter module.
Figure 7B:
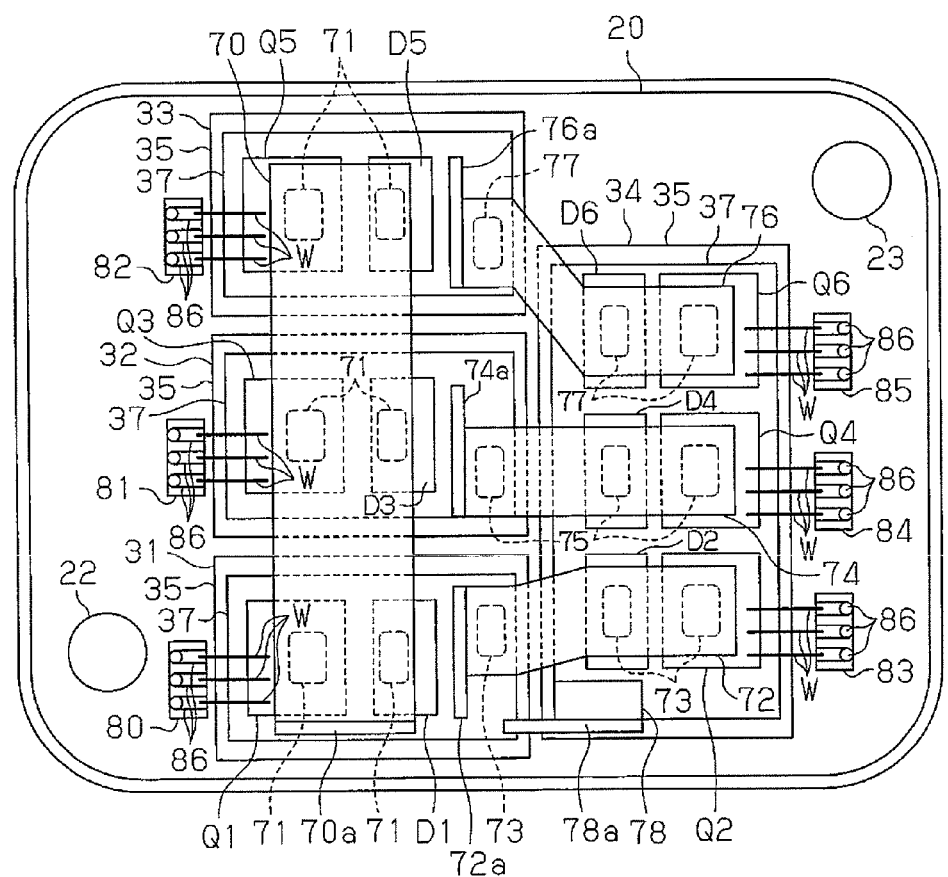
FIG. 7B is a plan view showing the inverter module of FIG. 7A.

Subsequently, referring to FIGS. 7A and 7B, each of the transistors Q1, Q2, Q3, Q4, Q5, and Q6 and each of the diodes D1, D2, D3, D4, D5, and D6 are soldered to the upper surface of the aluminum layer 37 on the ceramic substrate 35 in the corresponding one of the insulating substrates 31, 32, 33, and 34.

At the same time, the conductive plates 70, 72, 74, 76, and 78 are soldered to the transistors Q1, Q2, Q3, Q4, Q5, and Q6 and the diodes D1, D2, D3, D4, D5, and D6. Further, the connection pin seats 80, 81, 82, 83, 84, and 85, on which the connection pins 86 are fixed, are fixed to the upper surface of the cooling device 20.

Further, the connection pins 86 are joined with the corresponding transistors (chips) Q1, Q2, Q3, Q4, Q5, and Q6 by the wire W. Then, the inlet pipe 22 and the outlet pipe 23 are coupled to the cooling device 20.

As shown in FIGS. 3A to 4B, the resin portion 40 is used to seal the components mounted on the cooling device 20. The components mounted on the cooling device 20 include the coupling between the cooling device 20 and the inlet pipe 22, the coupling between the cooling device 20 and the outlet pipe 23, the insulating substrates 31, 32, 33, and 34, the transistors Q1, Q2, Q3, Q4, Q5, and Q6, the diodes D1, D2, D3, D4, D5, and D6, the conductive plates 70, 72, 74, 76, and 78, the connection pins 86, and the wire W. The resin portion 40 is molded at about 120° C.

The above embodiment has the advantages described below.

(1) The inverter module unit 10, which serves as a power conversion device, includes the inverter modules 11 and 12. Each of the inverter modules 11 and 12 includes the cooling device 20 serving as a heat dissipation member provided with a heat dissipation portion, the insulating substrates 31, 32, 33, and 34, the transistors Q1, Q2, Q3, Q4, Q5, and Q6, the diodes D1, D2, D3, D4, D5, and D6, the conductive plates 70, 72, 74, 76, and 78, the connection pins 86, and the resin portion 40. The resin portion 40 is molded to the insulating substrates 31 to 34, the transistors Q1 to Q6, the diodes D1 to D6, the first ends of the conductive plates 70, 72, 74, 76, and 78, the first ends of the connection pins 86, and at least part of the cooling device 20. Further, the inverter modules 11 and 12 each form a unit. Thus, each inverter module may be exchanged with a new one when replacing components. This allows for measures (replacements) to be easily performed when deterioration occurs in a component (e.g., element, conductive plate, connection pin, and wire).

Since a single cooling device is provided for each inverter, the inverter module unit includes a plurality of inverters. This facilitates the replacement of deteriorated components as compared to when the same cooling device is shared by a plurality of inverters.

More specifically, an inverter module is formed for each inverter (six sets of a transistor and diode), and a resin portion is molded to each inverter module. This allows for freedom in the inverter module structure (layout and mounting form). Further, an integrated type module, which includes the cooling device 20 and an inverter, has the same size as a single inverter. When an inverter module unit includes a plurality of inverters, inverter modules can be arranged next to one another, and a resin portion can be molded to each inverter module. This allows for freedom in the layout of the inverter modules and facilitates the replacement of components such as deteriorated semiconductor elements.

(2) The cooling device 20, which serves as a heat dissipation member, includes the coolant passage P1 and thus has a superior heat dissipation property.

(3) The pipes 91, 92, 93, and 94 connect the inverter modules 11 and 12 and form a passage for coolant between the inverter modules 11 and 12. This facilitates the replacement of components.

(4) The inverter modules 11 and 12 are arranged beside each other on the same flat plane. This allows for the inverter module unit 10 to have a low height.

It should be apparent to those skilled in the art that the present invention may be embodied in many other specific forms without departing from the spirit or scope of the invention. Particularly, it should be understood that the present invention may be embodied in the following forms.

The inverter modules 11 and 12 are connected in parallel by coolant pipes as shown in FIGS. 1A and 1B. However, as shown in FIGS. 8A and 8B, the inverter modules 11 and 12 may be connected in series by coolant pipes 96, 97, and 98.

Figure 9:
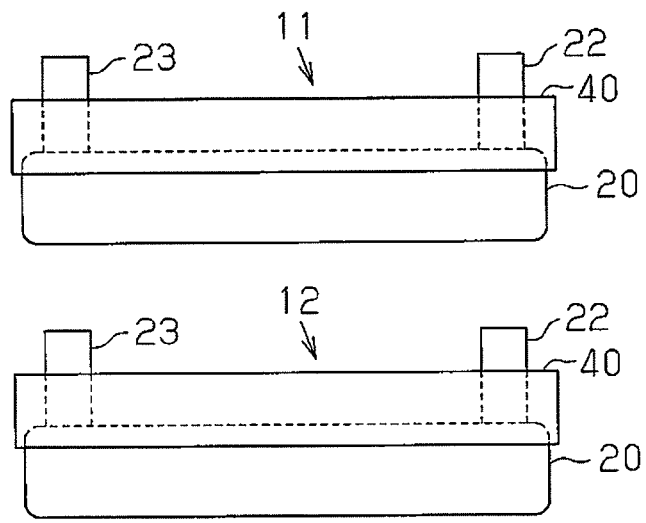
FIG. 9 is a front view showing a modified inverter module unit.

As shown in FIG. 9, the inverter modules 11 and 12 may be arranged in an overlapping state. The overlapping arrangement decreases the area occupied by the inverter modules 11 and 12.

Figure 10:
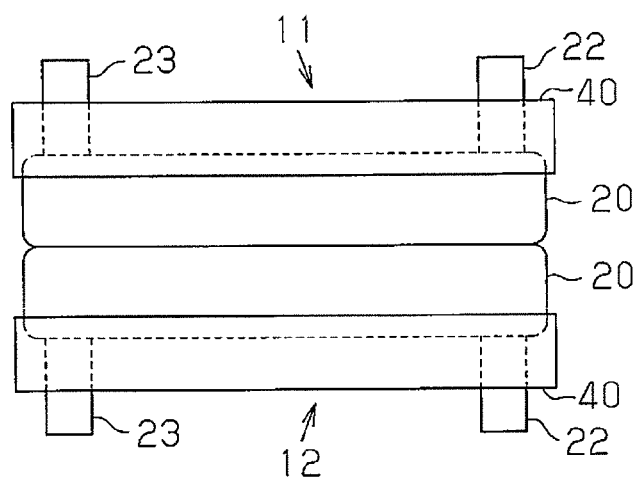
FIG. 10 is a front view showing a modified inverter module unit.

As shown in FIG. 10, the inverter modules 11 and 12 may be stacked in a state in which the cooling devices 20 are in contact with each other.

Figure 11:
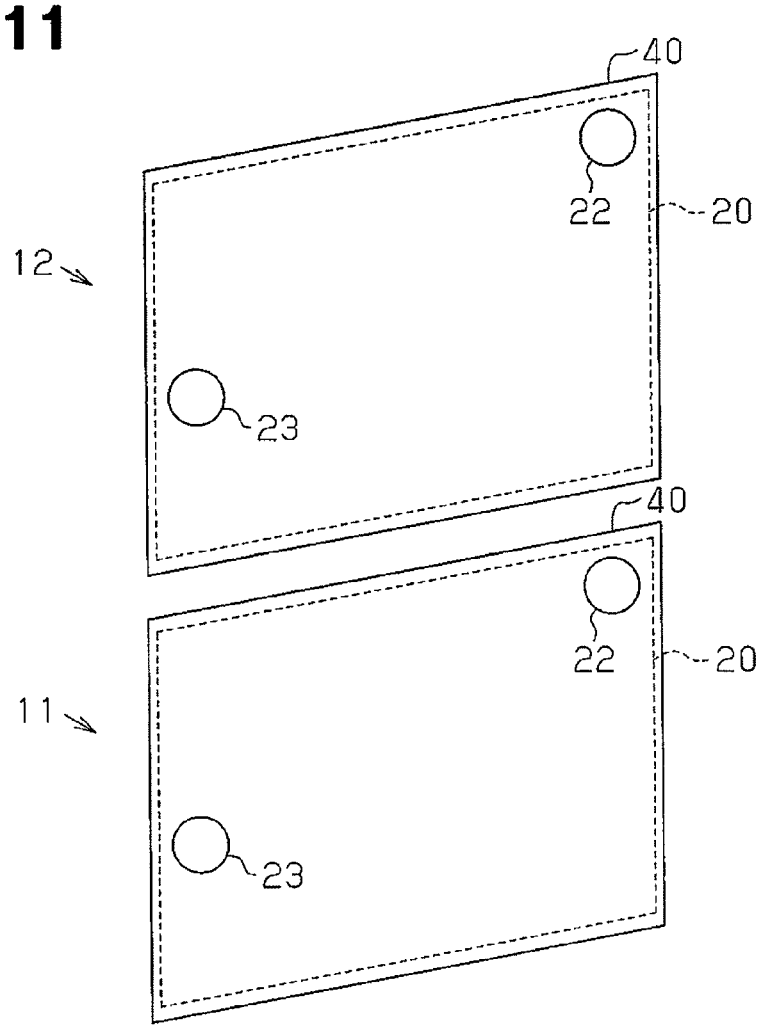
FIG. 11 is a plan view showing a modified inverter module unit.

As shown in FIG. 11, unnecessary portions of the cooling device 20 (for example, the regions denoted A1 and A2 in FIG. 4B) may be eliminated to form the cooling device 20 with a diamond shape. In this manner, by changing the shape of the entire module, more space can be provided when arranging the inverter modules 11 and 12 next to each other.

Figure 12:
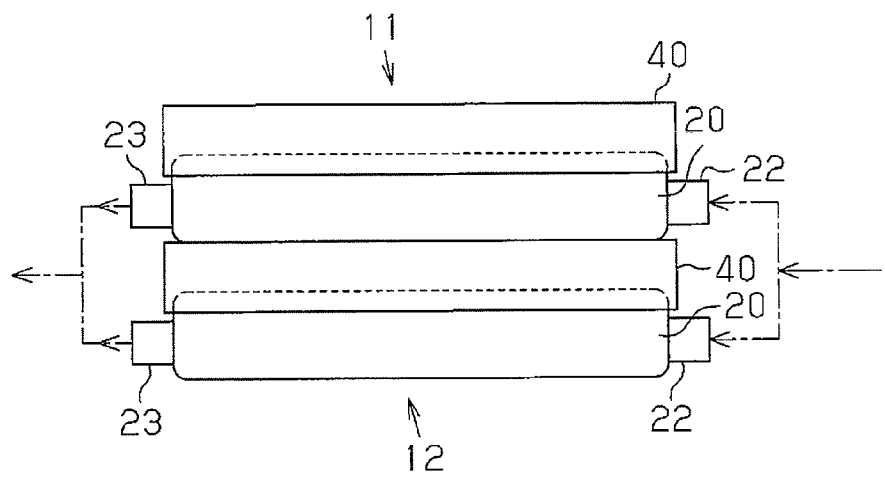
FIG. 12 is a front view showing a modified inverter module unit.

As shown in FIG. 12, the inlet pipe 22 and the outlet pipe 23 may be arranged on the side surfaces of the cooling device 20 so that the pipes 22 and 23 extend horizontally. When the inverter modules 11 and 12 are in an overlapped arrangement, the horizontal extension of the pipes 22 and 23 provides more space in the overlapping direction of the inverter modules 11 and 12.

Although the insulating substrates 31, 32, 33, and 34 are DBA substrates, the insulating substrates may be direct brazed copper (DBC) substrates, each including a ceramic substrate 35 sandwiched by copper layers.

Although there are two modules in the above embodiment, there may be three or more modules.

Figure 13:
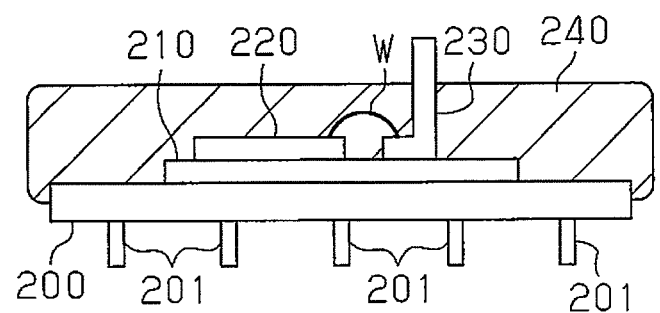
FIG. 13 is a cross-sectional view showing a modified inverter module.

Although a water-cooling type cooling device is used in the above embodiment, an air-cooling type cooling device may be used. More specifically, for example, as shown in FIG. 13, a heat sink 200 may include one surface serving as a substrate joining surface and another surface serving as a heat dissipation surface. An insulating substrate 210 is joined with the substrate joining surface of the heat sink 200, and a semiconductor element 220 is mounted on the insulating substrate 210. A first end of an external connection terminal 230 is electrically connected by a wire W to the semiconductor element 220. Then, the resin portion 240 is molded to these components. For an air-cooling type cooling device, fins 201 may be coupled to the heat sink 200.

The cooling device of one of the modules in an inverter module unit may be of a water-cooling type and the cooling device of the other module may be of an air-cooling type.

Although the present invention is applied to an inverter that functions as a power conversion device, the invention may be applied to another type of a power conversion device, such as a converter.

Although each inverter module is divided into six arms (six transistors and diodes), the arms may be further divided into, for example, two arms (two transistors and diodes).

The present examples and embodiments are to be considered as illustrative and not restrictive, and the invention is not to be limited to the details given herein, but may be modified within the scope and equivalence of the appended claims.

The invention claimed is:

1. A power conversion device comprising a plurality of semiconductor modules,
    each of the semiconductor modules including
    a heat dissipation member including a heat dissipation portion,
    an insulating substrate having a lower surface and an upper surface, the lower surface of the insulating substrate being fixed to the heat dissipation member,
    a semiconductor element mounted on the upper surface of the insulating substrate,
    an external connection terminal including a first end, which is electrically connected to the semiconductor element, and an opposite second end, and
    a resin portion molded to the insulating substrate, the semiconductor element, the first end, and at least part of the heat dissipation member, wherein the resin portion covers the insulating substrate, and
    wherein the semiconductor modules each form a unit.

2. The power conversion device according to claim 1, wherein the resin portion is molded in a state in which the second end is exposed from the resin portion.

3. The power conversion device according to claim 1, wherein the heat dissipation member is a cooling device that includes a coolant passage.

4. The power conversion device according to claim 3, further comprising a pipe connecting the semiconductor modules to form a passage for coolant between the semiconductor modules.

5. The power conversion device according to claim 1, wherein the semiconductor modules are arranged beside each other on the same plane.

6. The power conversion device according to claim 1, wherein the semiconductor modules are overlapped to each other.

7. The power conversion device according to claim 1, further comprising an upper portion of the heat dissipation member being positioned within the resin portion.

8. The power conversion device according to claim 1, further comprising the semiconductor element being directly mounted on the upper surface of the insulating substrate.

9. The power conversion device according to claim 1, further comprising the semiconductor element being mounted to the upper surface of the insulating substrate.

* * * * *